United States Patent
Rudberg et al.

(10) Patent No.: US 6,462,691 B2
(45) Date of Patent: Oct. 8, 2002

(54) SCRAMBLER AND A METHOD OF SCRAMBLING DATA WORDS

(75) Inventors: Mikael Karlsson Rudberg; Mark Vesterbacka; Niklas Andersson, all of Linköping (SE); Jacob Wikner, Swindon (GB)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 09/861,525

(22) Filed: May 22, 2001

(65) Prior Publication Data

US 2002/0027519 A1 Mar. 7, 2002

(30) Foreign Application Priority Data

May 23, 2000 (SE) ............................................. 0001917

(51) Int. Cl.[7] ................................................. H03M 1/66
(52) U.S. Cl. ........................ 341/144; 341/150; 341/153; 341/118
(58) Field of Search ................................ 341/144, 150, 341/153, 118

(56) References Cited

U.S. PATENT DOCUMENTS

| | | | |
|---|---|---|---|
| 5,404,142 A | * | 4/1995 | Adams et al. ............... 341/144 |
| 5,625,360 A | * | 4/1997 | Garrity et al. ............... 341/144 |
| 5,936,564 A | | 8/1999 | Jun |
| 5,955,979 A | * | 9/1999 | Knudsen ...................... 341/118 |
| 6,124,813 A | * | 9/2000 | Robertson et al. .......... 341/143 |
| 6,154,162 A | * | 11/2000 | Watson et al. ............... 341/150 |
| 6,329,940 B1 | * | 12/2001 | Dedic .......................... 341/144 |

FOREIGN PATENT DOCUMENTS

GB   2233171   * 7/1999

* cited by examiner

Primary Examiner—Michael Tokar
Assistant Examiner—Khai M. Nguyen
(74) Attorney, Agent, or Firm—Burns, Doane, Swecker & Mathis, L.L.P.

(57) ABSTRACT

To minimize the number of positions to be altered in a transition from one output data word to the next in a scrambler for scrambling successive, thermometer coded binary input data words comprising N bits into corresponding successive output data words also comprising N bits, the scrambler is adapted, if the number of bits of one binary value has increased from one input data word to the next, to maintain bits of said one binary value in positions in the corresponding output data word where the previous output data word had bits of said one binary value, and to randomize the remaining bits of said one binary value to positions in the corresponding output data word where the previous output data word had bits of the other binary value.

14 Claims, 3 Drawing Sheets

SCRAMBLER AND A METHOD OF SCRAMBLING DATA WORDS

This application claims priority under 35 U.S.C. §§ 119 and/or 365 to 0001917-4 filed in Sweden on May 23, 2000; the entire contents of which are hereby incorporated by reference.

TECHNICAL FIELD

The invention relates generally to D/A converters and more specifically to a method of scrambling or randomization of thermometer coded input data in order to reduce the influence of matching errors in D/A converters.

BACKGROUND OF THE INVENTION

Due to time-mismatches in the switching of the output in the D/A converters (DACs), a wrong output may be generated for short periods of time. A worst case scenario is the transition between the binary codes <01 . . . 11> and <10 . . . 00>. For a short moment, the maximal output code <11 . . . 11> may appear, resulting in a large current spike, a so-called glitch, on the output. Glitches are a large problem since they put an upper limit on the speed-performance of DACs.

One solution to this problem is to use a thermometer coded DAC.

When using a thermometer code as input, no weights will be switched on in the DACs at the same time as other weights are switched off. Hence, glitches are reduced.

Unfortunately, this good property of the thermometer code is spoiled when so-called dynamic element matching (DEM) technique is introduced in the DACs.

In a DAC using DEM architecture, the signal path through the converter is randomized in order to decorrelate mismatch errors from the DAC weights and the output signal. In a thermometer coded DAC, all weights are equally large and it is therefore the most suitable architecture for randomization. Without randomization, a specific set of weights are assigned to each code and the influence of the matching error will become highly signal dependent. In view hereof, the SFDR (Spurious-Free Dynamic Range) will be poor. Since all bits are weighted equally in the thermometer code, there are many combinations that represent the same decimal value. Since all weights are equally large, different sets of weights may be randomly assigned to each code at different time instants. This is sometimes referred to as scrambling.

For example, in a randomized thermometer coded 14-bit DAC, there are 16383 different weights to choose from when applying the code 000 . . . 0001 at the input. Time-averaging the result, i.e. the static output amplitude levels, the weights become dynamically matched.

As long as the variation of weight assignment is uncorrelated with the input signal, the distortion terms arising from the matching errors will be transformed into noise.

A large drawback with all the commonly known DEM techniques is problems with glitches.

SUMMARY OF THE INVENTION

The object of the invention is to combine the glitch minimizing property of the thermometer code with the good SFDR performance from the use of DEM techniques.

Basically this is attained by randomly selecting what weights to switch on only among the combinations that result in minimal glitching.

BRIEF DESCRIPTION OF THE DRAWING

The invention will be described more in detail below with reference to the appended drawing on which

DESCRIPTION OF THE INVENTION

Both randomization of thermometer coded data and randomization of modified thermometer coded data will be described.

Method 1

Randomization of Thermometer Coded Data

Instead of randomly selecting positions in which "1"s should be added to or removed from in the thermometer coded data, the random selection of weights may be implemented as a network of switches, also called a scrambler.

Figure 1:
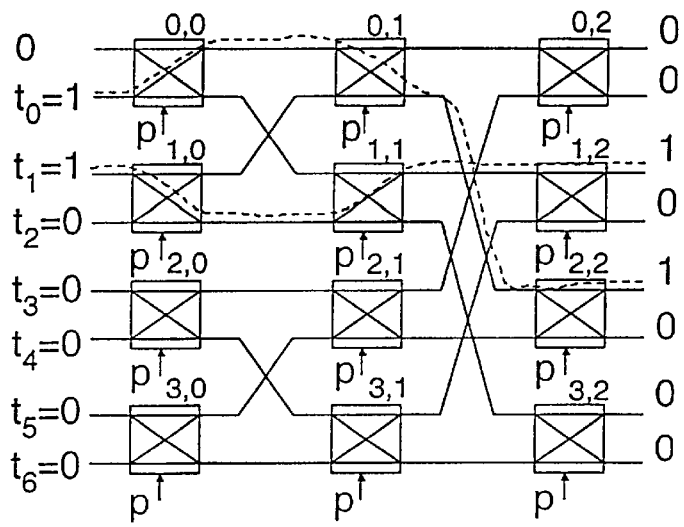
FIGS. 1, 2, and 3 show an embodiment of a randomization switch net or scrambler according to the invention with three different input data words.
Figure 2:
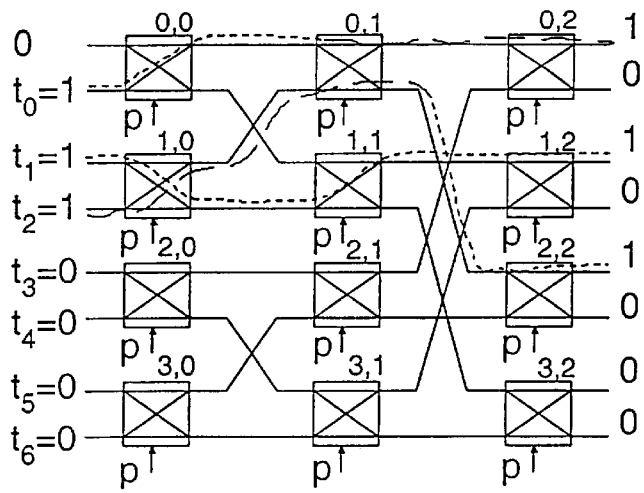
Figure 3:
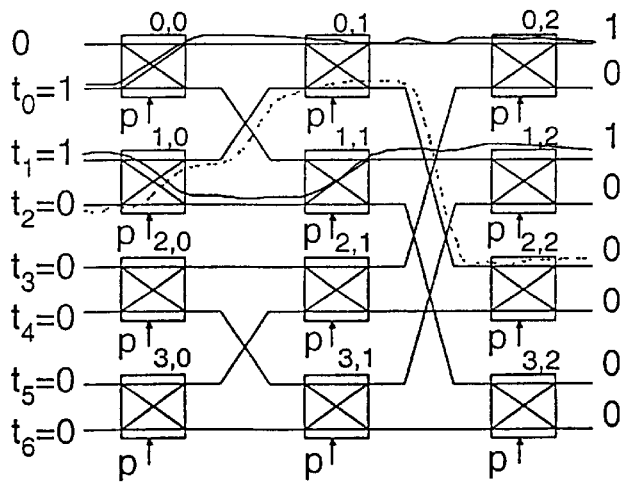

FIGS. 1, 2, and 3 illustrate an embodiment of such a network or scrambler comprising twelve switches (0,0), (0,1) . . . (3,2), where each switch (0,0), (0,1) . . . (3,2) is controlled by a random signal p, which is generated by a PRBS (Pseudo Random Binary Sequence) generator (not shown).

Figure 4:
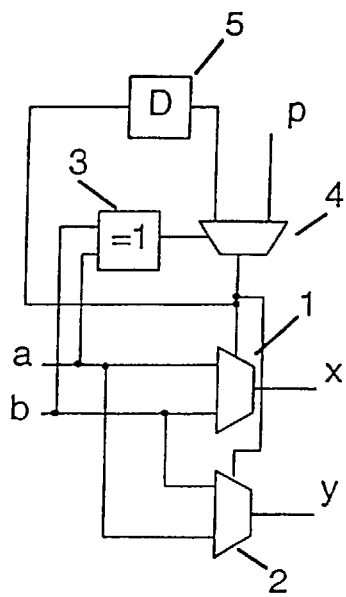
FIG. 4 shows an embodiment of a switch to be used in the net in FIGS. 1, 2, and 4, FIGS. 5, 6, and 7 show another embodiment of a randomization switch net or scrambler according to the invention with three different input data.

An embodiment of a switch to be used in the network in FIGS. 1, 2, and 3 is illustrated in FIG. 4.

In order to avoid unnecessary switching, only the changes between two samples are to be randomized. Since the weights that are on (or off) for a given code are not deterministic, the old path through the switching tree must be saved or preserved, which will require some extra storage element compared to full randomization where old paths through the switching network are not considered.

Each switch (0,0), (0,1) . . . (3,2) has two one-bit data inputs a, b and two one-bit data outputs x, y. Which input to connect to which output is selected by the random signal p. The degree of randomization depends on the depth of the switch net, which is dependent on what can be afforded of area reasons, and what actually is needed in the DAC.

In the embodiment of the switch illustrated in FIG. 4, the switch inputs a, b are connected to respective inputs of two multiplexers 1, 2. The outputs of the multiplexers 1 and 2 constitute the switch outputs x and y, respectively. The switch inputs a, b are also connected to respective inputs of an EXCLUSIVE-OR gate 3. The output of the EXCLUSIVE-OR gate 3 is connected to a control input of a multiplexer 4. One input of the multiplexer 4 is connected to the PRBS generator (not shown) generating the signal p, while the other input of the multiplexer 4 is connected to an output of a D flip-flop 5 on which the previous state $c_{old}$ of the switch appears. The output of the multiplexer 4 is connected to control inputs of the multiplexers 1, 2 as well as to an input of the D flip-flop on which the actual state c of the switch is received.

Generally, the switch in FIG. 4 should implement the following Boolean equations:

$$x = a*(b + \text{not}(c_{old})) + b*c_{old}$$

$$y = a*c_{old} + b*\text{not}(c_{old})$$

$$c = p*c + p*\text{not}(a \text{ xor } b) + c*(a \text{ xor } b)$$

In Table 1 below, a truth table for the switch is shown.

TABLE 1

| a | b | C | Comment |
|---|---|---|---------|
| 0 | 0 | P | Randomize |
| 0 | 1 | $c_{old}$ | Keep old setting |
| 1 | 0 | $c_{old}$ | Keep old setting |
| 1 | 1 | P | Randomize |

With reference to FIGS. 1–3, an example will now be given to illustrate how randomization in accordance with the invention by means of switches is carried out in a typical case.

In this example, the thermometer coded input data words are supposed to contain six positions denoted $t_0$–$t_6$.

In all switch nets illustrated, an extra "0" has been added to the input data word. This has been done to get a better symmetry in the net.

Three successive thermometer coded input data words $v_i$, $v_{i+1}$, and $v_{i+2}$ and the corresponding output data words $w_i$, $w_{i+1}$, and $w_{i+2}$, respectively, are considered. The word length in this example is set to seven bits, $v_i$=0000011, $v_{i+1}$=0000111 and $v_{i+2}$=0000011. The switch net is assumed to have the state shown in FIG. 1 after that the word $v_i$ has been fed through the net. The path for $v_i$ through the net is shown with dotted lines.

When $v_{i+1}$ is applied to the input of the net, an additional "1" appears in the input word. In order to find a new path through the net, the setting of each switch is updated according to Table 1.

FIG. 2 illustrates the switch net with $v_{i+1}$ as input data word.

Switch (0,0) has one input with "1" and one with "0". Therefore, the old switch setting (c=$c_{old}$) is kept.

Switch (1,0) now has two "1"s as input and a new random value of c (c=p) can be chosen. In this example, this new random value happens to be the same as before.

Switch (2,0) and (3,0) only has zeros as input and therefore the switch is randomly set (c=p).

Switch (0,1) will get two "1"s as input and a new random value of c (c=p) can be chosen. Here, a new setting of the switch is obtained.

Switch (1,1) will have one "0" and one "1" as input and therefore the old switch setting (c=$c_{old}$) is kept.

Switches (2,1) and (3,1) only have "0"s inputs and therefore the switches are set randomly (c=p).

Switch (0,2) has one "0" and one "1" and therefore the old setting is kept. Note, however that during the previous sample, there was two "0"s at the input, and hence the switch setting was updated last sample period.

Switches (1,2) and (2,2) both have one "0" and one "1" as input data and therefore the old settings are kept.

Switch (3,2) only has "0"s as inputs and therefore the switch is set randomly (c=p).

Note that the output data $w_i$=00010100 and $w_{i+1}$=00010101 from sample i and sample i+1, respectively, only differ in one position, and that all positions that previously were "1"s, are preserved.

FIG. 3 illustrates the switch net when $v_{i+2}$ is applied as input data word.

Switch (0,0) will keep the state from previous sample.

Switches (1,0) and (0,1) now have different values at the input, and will keep the previous state. Note that these switches both got a new setting when $v_{i+1}$ was applied.

Switches (0,0) and (0,2) maintain the previous state since the values at the inputs differ.

Switches (2,0), (2,1), (2,2), (3,0), (3,1), and (3,2) have all "0"s at the inputs and will get a new state (c=p).

Note that despite that $v_i$ and $v_{i+2}$ have the same value, $w_i$=0001010 and $w_{i+2}$=00000101 are different, i.e. randomness has been added to the system.

Method 2
Randomization of Modified Thermometer Coded Data

Method 1 described above uses thermometer coded input data. However, there are other codes that are easier to construct, but that do not have the desired properties with low glitching. Instead of using thermometer coded input data, a code is defined that has an equal number of "1"s as thermometer coded data for all values, but with different ordering of the data. In this modified thermometer code, the binary coded data is just copied as many times as the binary weight corresponds to. Table 2 below shows thermometer code and modified thermometer code.

TABLE 2

| Binary code | Thermometer code | Modified thermometer code |
|---|---|---|
| 000 | 0000000 | 0000000 |
| 001 | 0000001 | 0000001 |
| 010 | 0000011 | 0000110 |
| 011 | 0000111 | 0000111 |
| 100 | 0001111 | 1111000 |
| 101 | 0011111 | 1111001 |
| 110 | 0111111 | 1111110 |
| 111 | 1111111 | 1111111 |

The advantage with using a modified thermometer code is that it is very easy to implement the logic for transforming binary coded data to modified thermometer code.

With this code, glitching is increased. However, if a switch which implements the truth table shown in Table 3 below, is used, increased glitching is avoided.

TABLE 3

| a' | B' | a | b | c | Comment |
|---|---|---|---|---|---------|
| 0 | 0 | 0 | 0 | p | Randomize |
| 0 | 1 | 0 | 1 | $c_{old}$ | Keep old setting |
| 1 | 0 | 0 | 1 | $c_{old}$ | Keep old setting |
| 1 | 1 | 1 | 1 | p | Randomize |

Figure 8:
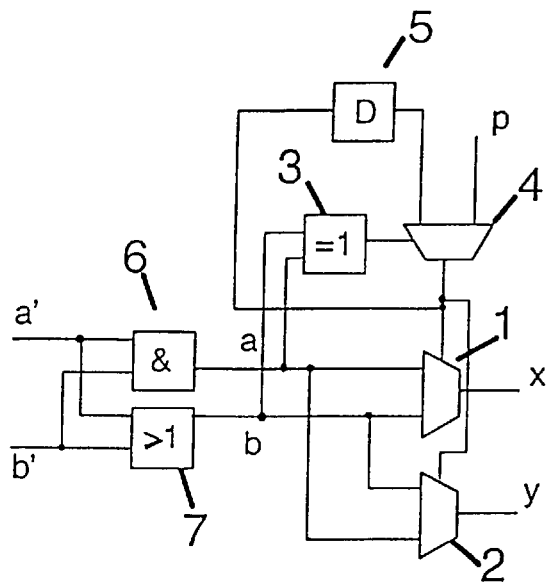
FIG. 8 shows an embodiment of a switch to be used in the net in FIGS. 5, 6, and 7.

An embodiment of the logic implementation of this modified switch is illustrated in FIG. 8.

Elements in the switch in FIG. 8 that are identical to those in FIG. 4 have been provided with the same reference characters.

In FIG. 8, the switch inputs are denoted a' and b', respectively, while a and b represent internal nodes in the switch.

The node a in FIG. 8 is connected to an output of an AND gate 6, while the node b is connected to an output of an OR gate 7. The inputs of the AND gate 6 and the OR gate 7 are connected to the inputs a' and b'.

Generally, the switch in FIG. 8 should implement the same functions as the switch in FIG. 4.

Figure 5:
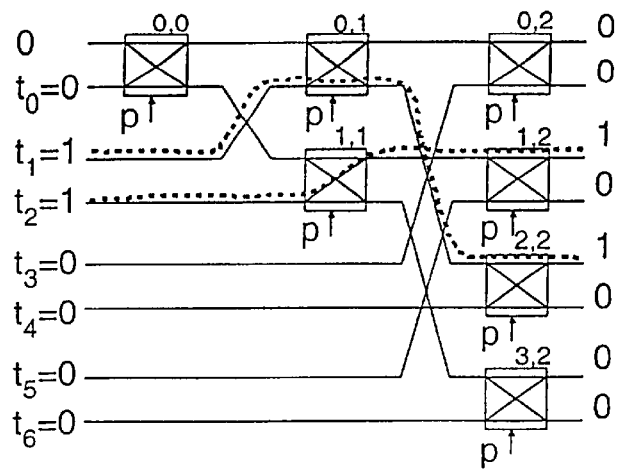

For the switch in FIG. 8, in the above functions listed for the switch in FIG. 5, a=a'*b' and b=a'+b'.

Figure 6:
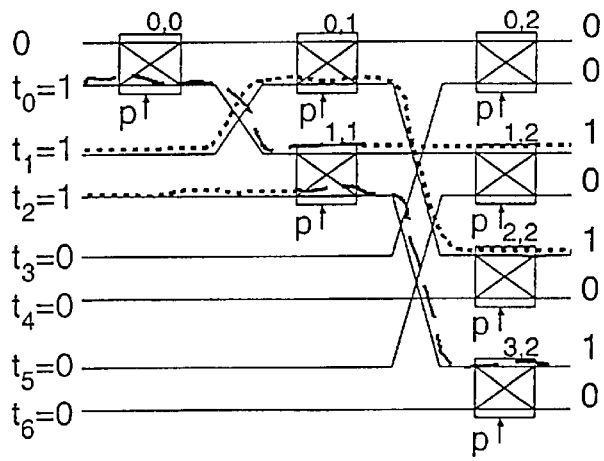
Figure 7:
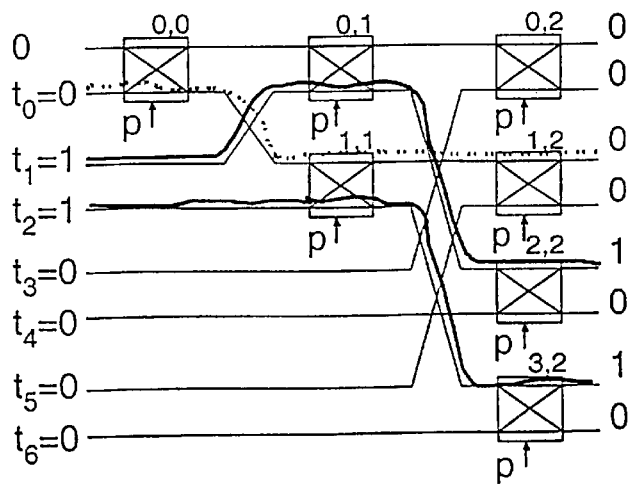

With reference to FIGS. 5–7, an example is given to illustrate how randomization using modified switches and modified thermometer code will look in a typical case.

Consider three successive thermometer coded input data words $v_i$, $v_{i+1}$, and $v_{i+2}$ and the corresponding output data words $w_i$, $w_{i+1}$, and $w_{i+2}$, respectively. The word length in this example is set to seven bits, $v_i$=0000110, $v_{i+1}$=0000111 and $v_{i+2}$=0000110. The switches in this example are of the type shown in FIG. 8. The switch net is assumed to have the state shown in FIG. 5 after that the first data word $v_i$ has been fed through the net. The path for $v_i$ through the net is shown with dotted lines.

When the next word, $v_{i+1}$, is applied to the input, an additional "1" is obtained in the input word. In order to find a new path through the net, the setting of each switch is updated in accordance with Table 3.

In FIG. 6, the switch net with $v_{i+1}$ as input data word is shown.

Switch (0,0) has one input with "1" and one with "0" and therefore the old switch setting (c=$c_{old}$) is kept. Note that this switch had two "0"s as input data during the previous sample, and that it therefore was randomly set at that sample.

Switch (0,1) will get one "0" and one "1" as input value and the old setting is preserved (c=$c_{old}$).

Switch (1,1) has two "1"s inputs and a new random value of c (c=p) can be chosen.

Switch (0,2) has two "0"s and a new random setting of the switch (c=$c_{old}$) is chosen.

Switches (1,2), (2,2), and (3,2) all have one "0" and one "1" as input data and therefore the old settings are kept.

Note that the output data $w_i$=00010100 and $w_{i+1}$=01010100 from sample i and sample i+1, respectively, only differ in one position, and that all positions that previously were "1"s, are preserved.

In FIG. 7, the third input data word $v_{i+2}$ is applied at the input.

Switches (0,0), (0,2) and (1,2) have only "0"s at the input and will therefore get a random state setting.

Switches (1,1), (2,2) and (3,2) all have one "1" and one "0" as inputs and will keep the old setting. However, the switch (1,1) had a random setting during the previous sample period.

Despite the fact that $v_i$ and $v_{i+2}$ have the same value, $w_i$=00010100 and $w_{i+2}$=01010000 are different, i.e. randomness has been added to the system with this method as well.

All Figures of switch nets only show examples of how they can be designed. If full randomization is desired, the number of layers in the nets in FIGS. 1, 2, 3, 5, 6, and 7 must be increased to the same depth as the number of bits in the input data word.

The switch net in FIGS. 5, 6, and 7 shows a minimum number of switches needed to preserve the minimum glitching property when using the modified thermometer code. If more switching layers are added, the switch in FIG. 8 does not have to be used. The switch in FIG. 4 works as long as the layers are added at the left edge in the Figures.

Figure 9:
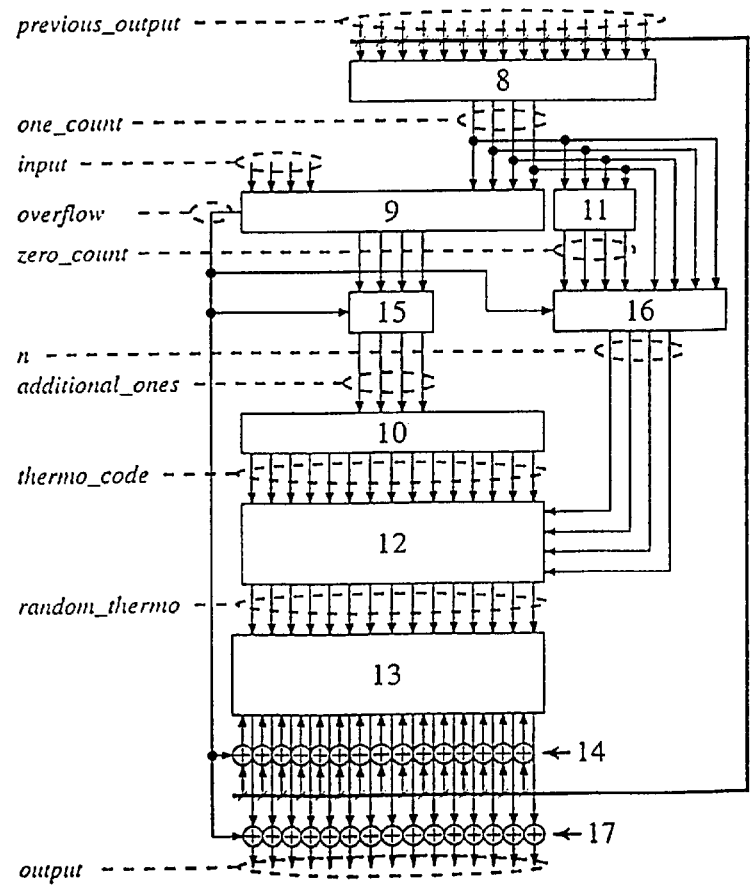
FIG. 9 illustrates a further embodiment of a scrambler according to the invention.

Another embodiment will be described below with reference to FIG. 9 showing a block diagram for a state selection function in a 4-bit DAC.

An arbitrary initial state, i.e. a previous output that selects the unit weights, of previous_output=101011101011111 which corresponds to a digital input of 11, i.e. 1011, is assumed.

The first operation to be performed is to count the number of ones in a counter 8, yielding one_count=11, i.e. 1011.

An arbitrarily chosen digital input to the DAC of input=13, i.e. 1101 is assumed, which primarily will be used to see how many zeros need to be set to one in the previous state (previous_output) to achieve the next state.

This is achieved by means of a subtractor 9 by the operation additional_ones=input−one_count=13−11=2 (0010).

To set two ones in the previous state (previous_output), two ones are first created literally in a binary-to-thermometer converter 10, which converts the number of additional ones into a thermometer code, i.e.

thermo_code=000000000000011.

Now, the strategy is to select as many bits (including all ones) as there are zero bits in the previous state (previous_output). To achieve this, the number of zeros in the previous state has to be known. This is a straightforward operation since the number of ones has already been counted and the total number of bits (15) in the state is known. A counter 11 performs exactly this by the operation zero_count=15 −one_count=15−11=4.

This count is used in a randomizer 12 to randomize the position of the corresponding number of bits. This operation R is illustrated by assuming that the randomization process happens to yield random_thermo=R(-----------0011)=-----------0110 where the bits not included in the randomization (15−4=11 bits) are indicated by "−".

Finally a distributor 13 distributes the randomized bits (random_thermo) in order to the zeros in the previous state (previous_output). All bits marked with a "−" above is simply disregarded.

The operations on the bits are illustrated with arrows below:

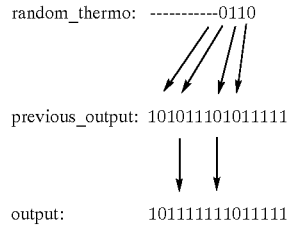

the four upper arrows going from the four randomized bits, indicate the order of which they should replace the zero bits in the previous state, and the two lower arrows indicate which of the two zeros that actually is set. The new state becomes output=101111111011111 which is output to the unit weights.

The scheme described above only handles the case where ones should be added to the previous state. For the case when the state value decreases, the scheme has to be slightly modified.

The case when the state value decreases can be detected, e.g. as an overflow from the subtractor 9 (overflow in FIG. 9). The approach is then to map this case to the hardware that solves the problem in the first case. In the first case, zeros were changed into ones, while in the second case ones should be changed into zeros in a similar way.

This can be achieved by inverting all zeros and ones in the case of overflow with a set of EXCLUSIVE-OR gates 14, and adjusting the number of ones to be operated on accordingly. To handle this case, a block 15 is provided between the subtractor 9 and the converter 10, that takes the magnitude of the count of additional ones, i.e. the operation additional_ones=|input−one_count| is performed instead.

Also, the zero count (zero_count) is updated to reflect the inverted input. However, since the new zero count simply is the old one count (one_count), a multiplexer 16 is needed that selects the appropriate count for the respective case (n in FIG. 9). Finally, the new state (output) is inverted with another set of EXCLUSIVE-OR gates 17 to map zeros and ones back to the expected output.

What is claimed is:

1. A method of scrambling successive, thermometer coded binary input data words having N bits into corresponding successive output data words also having N bits, the method comprising the steps of:

maintaining certain bits of a binary value in positions of an output data word where a previous output data word had bits of the binary value; and randomizing a remaining number of bits of the binary value to positions in the output data word where the previous output data word had bits of another binary value to minimize the number of positions to be altered in a transition from the previous output data word to the output data word;

wherein a switch net maintains the certain bits and randomizes the remaining number of bits of the binary value, the switch net including a plurality of switches, each switch being adapted to implement the Boolean equations:

$x = a*(b+not(c_{old}))+b*c_{old}$;

$y = a*c_{old}+b*not(c_{old})$; and $c = p*c+p*not(a\ xor\ b)+c*(a\ xor\ b)$;

where a and b are the inputs of the switch, x and y are the outputs of the switch, c is the actual state of the switch, $c_{old}$ is the previous switch state, and p is a random signal.

2. A scrambler for scrambling successive, thermometer coded binary input data words having N bits into corresponding successive output data words also having N bits, the scrambler comprising:

means for adapting the scrambler to maintain certain bits of a binary value in positions of an output data word where a previous output data word had bits of the binary value when the number of bits of the binary value has increased from one input data word to a next input data word; a a randomizer that randomizes a remaining number of bits of the binary value to positions in the output data word where the previous output data word had bits of another binary value to minimize a number of positions to be altered in a transition from the previous output data word to the output data word;

wherein a switch net maintains the certain bits and randomized the remaining number of bits of the binary value, the switch net including a plurality of switches, each switch being adapted to implement the Boolean equations:

$x = a*(b+not(c_{old}))+b*c_{old}$;

$y = a*c_{old}+b*not(c_{old})$; and $c = p*c+p*not(a\ xor\ b)+c*(a\ xor\ b)$;

where a and b are the inputs of the switch, x and y are the outputs of the switch, c is the actual state of the switch, $c_{old}$ is the previous switch state, and p is a random signal.

3. A scrambler for scrambling successive, thermometer coded binary input data words having N bits into corresponding successive output data words also having N bits, the scrambler comprising:

counters for counting a number of ones and zeros in a previous output data word;

means for determining a number of additional ones to be added to the previous output data word;

a converter for converting the number of additional ones into a thermometer code;

a randomizer for randomizing a number of bits of the thermometer code equal to the number of zeros in the previous output data word; and a distributor for distributing the randomized bits of the theremometer code, in order, to the bit locations of the zeros in the previous data wore.

4. The scrambler of claim 3, wherein the means for determining a number of additional ones comprises:

a substractor that determines a difference between a number of ones in an input data word and the number of ones in the previous output data word.

5. The scrambler of claim 4, further comprising:

means for determining a magnitude of the difference between the number of ones in the input data word the number of ones in the previous output data word.

6. The scrambler of claim 5, wherein when the magnitude of the difference is positive, the difference equals the number of additional ones.

7. The scrambler of claim 5, wherein when the magnitude of the difference is negative, the difference equals a number of additional zeros to be added to the previous output data word.

8. The scrambler of claim 7, further comprising:

a converter for converting the number of additional zeros into an inverse thermometer code;

a randomizer for randomizing a number of bits of the inverse thermometer code equal to the number of ones in the previous output data word; and a distributor for distributing the randomized bits of the inverse thermometer code, in order, to the bit locations of the ones in the previous data word.

9. A method for scrambling successive, thermometer coded binary input data words having N bits into corresponding successive output data words also having N bits, the scrambler comprising:

counting a number of ones and zeros in a previous output data word;

determining a number of additional ones to be added to the previous output data word;

converting the number of additional ones into a thermometer code;

randomizing a number of bits of the thermometer code equal to the number of zeros in the previous output data word; and distributing the randomized bits of the thermometer code, in order, to the bit locations of the zeros in the previous data word.

10. The method of claim 9, wherein the step of determining a number of additional ones comprises the step of:

determining a difference between a number of ones in an input data word and the number of ones in the previous output data word.

11. The method of claim 10, further comprising the step of:

determining a magnitude of the difference between the number of ones in the input data word the number of ones in the previous output data word.

12. The method of claim 11, wherein when the magnitude of the difference is positive, the difference equals the number of additional ones.

13. The method of claim 11, wherein when the magnitude of the difference is negative, the difference equals a number of additional zeros to be added to the previous output data word.

14. The method of claim 13, further comprising the steps of:

converting the number of additional zeros into an inverse thermometer code;

randomizing a number of bits of the inverse thermometer code equal to the number of ones in the previous output data word; and distributing the randomized bits of the inverse thermometer code, in order, to the bit locations of the ones in the previous data word.

* * * * *